United States Patent
Eriksson

[11] Patent Number: 5,942,945
[45] Date of Patent: Aug. 24, 1999

[54] ARRANGEMENT FOR PROTECTING THE OUTPUT TRANSISTORS IN A POWER AMPLIFIER

[75] Inventor: Hans Eriksson, Järfälla, Sweden

[73] Assignee: Telefonaktiebolaget LM Ericsson, Stockholm, Sweden

[21] Appl. No.: 08/961,019

[22] Filed: Oct. 30, 1997

[30] Foreign Application Priority Data

Nov. 8, 1996 [SE] Sweden ................................. 9604101

[51] Int. Cl.⁶ .............................. H02H 7/20; H03F 21/00
[52] U.S. Cl. ........................................ 330/298; 330/207 P
[58] Field of Search ................................... 330/298, 266, 330/272, 289, 207 P

[56] References Cited

U.S. PATENT DOCUMENTS

| | | | |
|---|---|---|---|
| 3,449,680 | 6/1969 | Schilb et al. ............................... | 330/11 |
| 3,942,075 | 3/1976 | Maran et al. . | |
| 4,152,668 | 5/1979 | Kusumi .................................... | 330/298 |
| 4,158,180 | 6/1979 | Challen .................................... | 330/298 |
| 4,523,154 | 6/1985 | Congdon ................................. | 330/266 |
| 4,757,271 | 7/1988 | Beale ...................................... | 330/255 |
| 4,779,161 | 10/1988 | DeShazo, Jr. ............................ | 330/298 |
| 5,383,083 | 1/1995 | Shinoda et al. .......................... | 361/103 |

*Primary Examiner*—Robert Pascal
*Assistant Examiner*—Patricia Nguyen
*Attorney, Agent, or Firm*—Burns, Doane, Swecker & Maths, L.L.P.

[57] ABSTRACT

In an arrangement for protecting the output transistors in a power amplifier against temperatures exceeding a predetermined first temperature value, a temperature sensor is provided adjacent to the output transistors to sense their temperature and influence the power amplifier when the first temperature value is reached. The temperature sensor is adapted to vary the driving current of the power amplifier inversely proportional to the temperature of the output transistors for temperature values between the first temperature value and a predetermined higher temperature value.

3 Claims, 1 Drawing Sheet

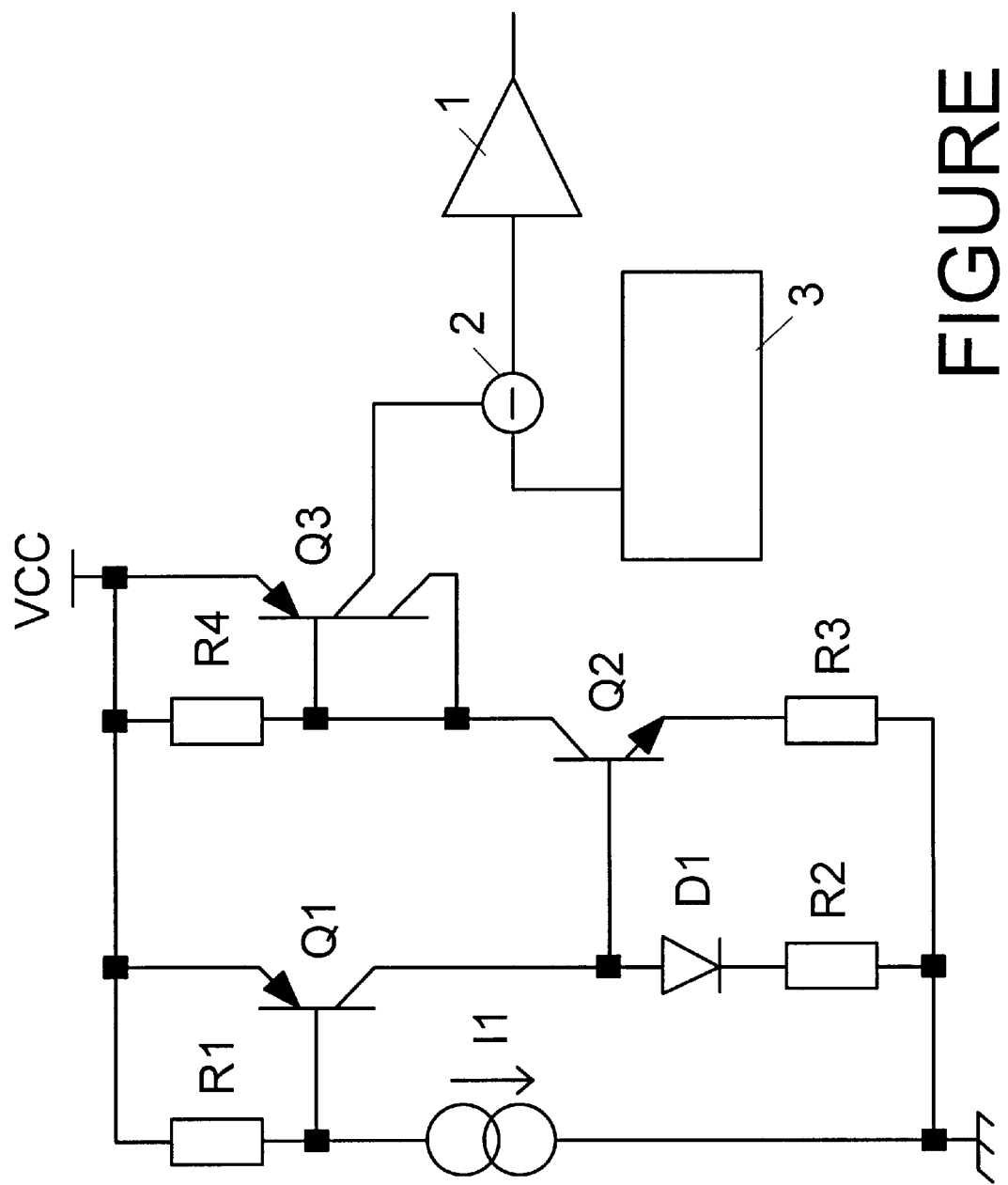
FIGURE

ARRANGEMENT FOR PROTECTING THE OUTPUT TRANSISTORS IN A POWER AMPLIFIER

TECHNICAL FIELD

The invention relates to an arrangement for protecting a power amplifier and, specifically, to an arrangement for protecting, in a power amplifier, the output transistors against temperatures exceeding a certain temperature.

BACKGROUND

In integrated power amplifiers, it is known to arrange a temperature sensing transistor adjacent to the output transistors in the power amplifier to sense the temperature of the output transistors and influence the power amplifier when its temperature has reached a predetermined temperature value.

These so-called temperature controllers normally operate in such a manner that at too high a silicon temperature, the power amplifier is turned off in order to let the output transistors cool to a lower temperature. When this lower temperature is reached, the power amplifier is again turned on and, anew, the temperatures rises. If the cause of the too high temperature remains, the power amplifier will, thus, alternately be turned off and on.

That the power amplifier alternately is turned off and on constitutes a problem in case the power amplifier constitutes the output stage of e.g. a subscriber line interface circuit whose operation is monitored by means of a microprocessor or a computer. Moreover, the transmission of e.g. speech and/or data through the line interface circuit will be impossible when the operation of the output stage is disturbed in this manner.

SUMMARY

The object of the invention is to bring about an arrangement which eliminates the problems with today's temperature controllers.

This is attained in that the arrangement according to the invention, at temperatures exceeding a predetermined value, reduces the driving current of the power amplifier inversely proportional to the temperature of the output transistors. Since the driving current is reduced at an increased temperature, the temperature will automatically be reduced without any interruption of the operation of the power amplifier.

The transmission of speech and/or data through e.g. the above line interface circuit can, thus, continue undisturbed until the line current supplied by the power amplifier becomes so low that a device, e.g. a telephone set, connected to the line, ceases to function.

BRIEF DESCRIPTION OF THE DRAWING

The invention will be described more in detail below with reference to the appended drawing, on which the single FIGURE shows an embodiment of an arrangement according to the invention for protecting a power amplifier.

DETAILED DESCRIPTION

The single FIGURE shows a circuit diagram of an embodiment of an arrangement according to the invention for protecting output transistors (not shown) in a power amplifier 1 against temperatures exceeding a predetermined temperature value.

In a manner known per se, the arrangement according to the invention comprises a temperature sensing transistor Q1 which in a manner not shown, is arranged adjacent to the output transistors (not shown) of the power amplifier 1 to sense their temperature. From the following, it will be understood that a diode is sufficient as a temperature sensor in place of a temperature sensing transistor.

In accordance with the invention, the temperature sensing transistor Q1 is adapted, in a manner to be described below, to vary the driving current of the power amplifier 1 inversely proportional to the temperature of the output transistors for temperatures between a first temperature value and a predetermined higher, second temperature value.

In the illustrated embodiment of the arrangement according to the invention, the emitter of the temperature sensing transistor Q1 is connected to a supply voltage VCC, while its base is connected, on the one hand, to the supply voltage VCC via a resistor R1 and, on the other hand, to ground via a current generator I1. The collector of the transistor Q1 is connected to the interconnection point between the base of a transistor Q2 and the anode of a diode D1. The cathode of the diode D1 is connected to ground via a resistor R2. The emitter of the transistor Q2 is connected to ground via a resistor R3, while its collector is connected to the supply voltage VCC via a resistor R4. The interconnection point between the collector of the transistor Q2 and the resistor R4, is connected to the base as well as a first collector of a multi-collector transistor Q3 whose emitter is connected to the supply voltage VCC.

A second collector of the transistor Q3 is connected to one input terminal of a current subtraction circuit 2 whose second input terminal is connected to the output terminal of a driving circuit 3 and whose output terminal is connected to the input terminal of the power amplifier 1. The driving circuit 3 is adapted to output on its output terminal, a current to the second input terminal of the subtraction circuit 2 for driving the power amplifier 1.

The subtraction circuit 2 is adapted to subtract from the current received from the driving circuit 3, the current received from the second collector of the transistor Q3 and supply the resulting difference current as driving current to the input terminal of the power amplifier 1.

For the following description, it is supposed in a manner known per se that the base-emitter voltage of a transistor is reduced essentially linearly with increasing temperature of the transistor.

According to the invention, the base-emitter path, or diode, of the transistor Q1 is biased to a voltage corresponding to the temperature at which the transistor is to be turned on and the driving current to the power amplifier 1 is to be reduced.

This voltage is set by the resistance of the resistor R1 and by the value of the current in the current generator I1.

The current mirror formed by the diode D1 and the transistor Q2, constitutes together with the resistors R2 and R3 an amplifier for amplifying a collector current of the transistor Q1.

By selecting the resistance of the resistor R4, a threshold value is set for the current from this amplifier, i.e. the collector current of the transistor Q2. For currents exceeding this threshold value, the multi-collector transistor Q3 will be conducting. A current exceeding the threshold value is mirrored to the second collector of the transistor Q3, which is connected to one input terminal of the subtraction circuit 2.

Thus, the current from the second collector of the transistor Q3 will be subtracted from the current coming from the driving circuit 3, whereby the driving current to the power amplifier 1 will be reduced. Hereby, the temperature of the output transistor (not shown) will be reduced.

If for some reason the temperature of the output transistors continues to increase, the current through the temperature sensing transistor Q1 will increase. When the temperature is so high and, thereby, the collector current of the transistor Q1 is so large that the output current from the second collector of the multi-collector transistor Q3 is as large as the input current from the driving circuit 3 to the subtraction circuit 2, the driving current from the subtraction circuit 2 to the power amplifier 1 will be zero. Consequently, at this temperature, the power amplifier 1 will be in an idle state due to the fact that there is no input driving current on its input terminal.

The resistance of the resistor R1 and the size of the current of the current generator I1 thus determine the temperature at which the driving current to the power amplifier is to be reduced.

The driving current continues to be reduced up to the temperature at which the driving current to the power amplifier 1 is zero. This temperature can be set by selecting the amplification of the collector current of the transistor Q1 in relation to the size of the current from the driving circuit 3.

What is claimed is:

1. An arrangement for protecting output transistors of a power amplifier against temperatures exceeding a predetermined temperature, comprising a temperature sensor which is adapted to sense the temperature of the output transistors, to generate a current in response to temperatures exceeding said predetermined temperature, and to influence a current to the power amplifier from a driving circuit, wherein a subtraction circuit is connected with its one input to the temperature sensor, with its other input connected to said driving circuit, and with its output connected to the power amplifier, the subtraction circuit being adapted to subtract the current generated by the temperature sensor from the current from said driving circuit to obtain a resulting current, and to supply this resulting current as driving current to the power amplifier.

2. The arrangement of claim 1, wherein the temperature sensor is a temperature sensing transistor.

3. The arrangement of claim 1, wherein the temperature sensor is adapted to generate a current that increases linearly with increasing temperatures exceeding said predetermined temperature.

\* \* \* \* \*